US011567206B1

(12) United States Patent
Ensher et al.

(10) Patent No.: US 11,567,206 B1
(45) Date of Patent: Jan. 31, 2023

(54) CHIP-SCALE COHERENT LIDAR UTILIZING QUANTUM DOTS

(71) Applicant: INSIGHT LIDAR, INC., Lafayette, CO (US)

(72) Inventors: Jason Ensher, Lafayette, CO (US); Christopher Wood, Lafayette, CO (US)

(73) Assignee: INSIGHT LIDAR, INC., Lafayette, CO (US)

( * ) Notice: Subject to any disclaimer, the term of this patent is extended or adjusted under 35 U.S.C. 154(b) by 368 days.

(21) Appl. No.: 16/876,331

(22) Filed: May 18, 2020

Related U.S. Application Data

(60) Provisional application No. 62/849,179, filed on May 17, 2019.

(51) Int. Cl.
| | | |
|---|---|---|
| *G01S 17/89* | (2020.01) | |
| *H01S 5/50* | (2006.01) | |
| *G01S 7/48* | (2006.01) | |
| *H01S 5/10* | (2021.01) | |

(52) U.S. Cl.
CPC ............ *G01S 17/89* (2013.01); *G01S 7/4804* (2013.01); *H01S 5/50* (2013.01); *H01S 5/101* (2013.01)

(58) Field of Classification Search
CPC .......... G01S 17/02; G01S 17/88; G01S 17/89; G01S 7/4804; H01S 5/50; H01S 5/101
See application file for complete search history.

(56) References Cited

U.S. PATENT DOCUMENTS

| | | | | |
|---|---|---|---|---|
| 6,212,002 B1* | 4/2001 | Lin | ..................... | H04B 10/2537 |
| | | | | 359/344 |
| 6,687,278 B1* | 2/2004 | Mason | ................ | H01S 5/06256 |
| | | | | 372/50.1 |
| 9,377,669 B2* | 6/2016 | Capua | ..................... | G02F 1/395 |
| 9,548,588 B1* | 1/2017 | Brown | ....................... | H01S 5/50 |
| 9,905,992 B1* | 2/2018 | Welford | ............... | G01S 7/4814 |
| 10,222,474 B1* | 3/2019 | Raring | .................. | H01S 5/0085 |
| 11,041,718 B2* | 6/2021 | Send | ..................... | G01B 11/026 |
| 2001/0046244 A1* | 11/2001 | Klimov | ................... | H01S 5/341 |
| | | | | 372/50.22 |
| 2002/0041736 A1* | 4/2002 | LoCasclo | ......... | H04B 10/25133 |
| | | | | 385/27 |

(Continued)

OTHER PUBLICATIONS

Mattias Lammlin; "Ga—As Semiconductor Optical Amplifiers with Quantum Dots as an Active Medium;" von der Fakultät II—Mathematik und Naturwissenschaften der Technischen Universität Berlin zur Erlangung des akademischen Grades (translation: from Faculty II—Mathematics and Natural Sciences the Technical University of Berlin for obtaining the academic degree) (Dec. 2006).

(Continued)

*Primary Examiner* — Peter M Bythrow

(57) ABSTRACT

A LiDAR system including a laser amplification system is disclosed. The laser amplification system includes a laser source and an optical amplifier. The laser source has a laser cavity and is configured to output electromagnetic radiation. The optical amplifier includes quantum dots and is positioned outside the laser cavity to receive the electromagnetic radiation output from the laser source. The optical amplifier amplifies the received electromagnetic radiation using the quantum dots and outputs the amplified electromagnetic radiation.

20 Claims, 5 Drawing Sheets

(56) References Cited

U.S. PATENT DOCUMENTS

| | | | |
|---|---|---|---|
| 2003/0067678 A1* | 4/2003 | Shibata | H01S 5/50 359/344 |
| 2004/0099858 A1* | 5/2004 | Lee | B82Y 20/00 257/13 |
| 2005/0045868 A1* | 3/2005 | Otsubo | H01S 5/2231 257/14 |
| 2006/0071218 A1* | 4/2006 | Takeda | H01L 21/02392 257/E33.005 |
| 2006/0087721 A1* | 4/2006 | Maeda | H04B 10/291 359/333 |
| 2007/0013996 A1* | 1/2007 | Verma | H01S 5/50 359/344 |
| 2008/0232817 A1* | 9/2008 | Futami | G02F 1/3523 398/160 |
| 2009/0015906 A1* | 1/2009 | Kimerling | H01S 3/0632 359/341.5 |
| 2016/0313445 A1* | 10/2016 | Bailey | G01S 7/4816 |
| 2017/0155225 A1* | 6/2017 | Villeneuve | G01S 7/4817 |
| 2018/0052378 A1* | 2/2018 | Shin | G02F 1/292 |
| 2018/0210083 A1* | 7/2018 | Fasching | G01S 7/4802 |
| 2019/0086550 A1* | 3/2019 | Dussan | G01S 7/4861 |
| 2019/0129206 A1* | 5/2019 | Lee | G02F 1/01708 |
| 2019/0265409 A1* | 8/2019 | Baehr-Jones | H01S 5/5027 |
| 2020/0358248 A1* | 11/2020 | Kurczveil | H01S 5/14 |

OTHER PUBLICATIONS

Justin C. Norman, et al; "Perspective: The future of quantum dot photonic integrated circuits;" APL Photonics 3, 030901 (2018) https://doi.org/10.1063/1.5021345.

Shuyu Yang et al.; "Quantum dot semiconductor optical amplifier/ silicon external cavity laser for O-band high-speed optical communications;" Optical Engineering (Apr. 2019) https://spiedigitallibrary.org/journals/Optical-Engineering.

M V Maximov et al. "A 1.33 µm InAs/GaAs quantum dot laser with a 46 cm-1 modal gain;" Semiconductor Science Technology (2008).

F. Gerschutz et al.; "Temperature insensitive 1.3 µm InGaAs=GaAs quantum dot distributed feedback lasers for 10 Gbit=s transmission over 21km;" Electronics Letters; vol. 42 No 25 (Dec. 2006).

N N Ledentsov; "Quantum dot laser;" Semiconductor Science and Technology; (2011) stacks.iop.org/SST/26/014001.

I. Krestnikov et al.; "Liability study of InAs/InGaAs quantum dot diode lasers;" Electronics Letters; vol. 41 No. 24 (Nov. 2005).

Tommy W. Berg et al.; "Quantum dot amplifiers with high output power and low noise;" Applied Physics Letters; vol. 82 No. 18 (May 2003).

* cited by examiner

CHIP-SCALE COHERENT LIDAR UTILIZING QUANTUM DOTS

RELATED APPLICATIONS

This application claims the benefit of 62/849,179 filed on May 17, 2019. Which is herein incorporated by reference in its entirety.

TECHNICAL FIELD

The present disclosure relates generally to laser sources and more particularly to amplification of laser sources.

BACKGROUND

Coherent LiDAR, or Frequency Modulated Continuous Wave (FMCW) LiDAR, or Swept Source LiDAR, represent a broad category of well-known techniques for laser-based distance measurements (ranging), laser-based metrology (measurements), laser-based vibrometry, and combined laser ranging and imaging, among other applications. Coherent LiDAR generally also provides velocity information along with distance.

With the emergence of driver assistance systems, autonomous vehicles (e.g. self-driving cars or trucks), drone-based services, human facial recognition, and other previously unforeseen markets, there is a need for laser systems with higher optical powers. For example, to ensure imaging at larger distances, LiDAR systems aim to include a laser system emitting light at around 200 mW. Such high optical power requirements are not unique to LiDAR.

In addition to larger power output, laser systems are also be confined to smaller physical dimensions to ensure that multiple laser systems are capable of being included on existing platforms (e.g., inside autonomous vehicles, drones, etc.).

SUMMARY

The system described herein relates generally to coherent laser radar (LiDAR) designs and configurations that can be scaled down to very small package sizes ('chip scale') suitable for low-cost, mass production. In particular, the system described herein addresses the need of Frequency Modulated Continuous Wave (FMCW) LiDAR, which in other contexts (such as medical applications) may be referred to as Optical Frequency Domain Imaging (OFDI) or Optical Coherence Tomography (OCT). In the context of fiber sensing, the analogous technique is Optical Frequency Domain Reflectometry (OFDR).

In medical and fiber-sensing, optical power requirements are considerably lower than for FMCW Lidar applications, such as automotive where the required sensing ranges can be up to 200-300 m, and in some scenarios up to 500 m. A particular challenge with the FMCW scenario is satisfying the requirement of eye-safe, high optical power levels even when the package size becomes very small. Another challenge is that the optical amplifier needs to maintain performance over a wide range of operating temperatures, typical in automotive environments, as the power requirements of active thermal control may exceed the power budget for the LIDAR system (a problem common to LiDAR for automotive applications). A solution to this issue utilizes gain media based on quantum dots for the active region in the laser transmitter for the LiDAR, and for an additional semiconductor optical amplifier (SOA) or tapered amplifier technology with quantum dots as the gain medium after the laser.

In the area of FMCW LiDAR, the laser source has particular characteristics that may limit the total output power of the device and require a separate output amplifier. FMCW LiDAR typically requires a laser source that is tunable over at least 5 GHz in a very short time (e.g., under 5 µsec). Furthermore, the sweep pattern may require a complex waveform, such as chirps that both increase and decrease in wavelength vs. time. To take advantage of certain solid-state beam steering schemes using dispersive elements, it is desirable to have very wide wavelength range in the laser, in some cases over 100 nm. Combining these tuning characteristics and delivering over 200 mW from the laser has not been achieved. Thus, it is easier to reduce the output power required from the laser and design the system using additional optical amplification outside the laser cavity.

Known optical amplifiers are not sufficient to meet the cost, size and performance requirements of automotive LiDAR, particularly in the volumes and costs needed. The world-wide automotive market was nearly 74 million new cars in 2017. Fiber amplifiers may be sufficient to meet the output power for performance and for lower volume manufacturing, but as volumes increase to millions, and cost and size become critical, the fiber amplifier is not appropriate. Regarding semiconductor optical amplifiers (SOAs), these are attractive because they are chip-scale components that may be integrated into an overall chip-scale lidar system, which can be cost-effectively manufactured in the millions. However, the optical power required for the overall LiDAR system far exceeds what is available today in SOAs based on quantum wells, and particularly in the InP material system at 1550 nm.

Much of the work in automotive lidar has migrated to the 1550 nm wavelength region, both because of the inherent eye safety but also the maturity of the InP material system for photonics and the ready availability of fiber-optic components. This has precluded looking at alternative approaches to automotive lidar and optical amplification.

A laser amplification system including a chip-scale optical amplifier (such as semiconductor optical amplifiers (SOAs) or tapered amplifiers (TAs)) based on quantum dots is provided as part of an overall chip-scale system.

Chip scale may refer to high volume gallium arsenide grown on 6 inch wafer. The wafer may include 100's or 1000's of optical amplifiers, such that an individual chip may be formed from the wafer with a length of a few millimeters to a few centimeters at most in length. In this example, the chip width may be only 0.5 mm wide for a single optical amplifier or an array with a pitch of approximately 10's of um up to about 250 µm.

While a number of features are described herein with respect to embodiments of the invention; features described with respect to a given embodiment also may be employed in connection with other embodiments. The following description and the annexed drawings set forth certain illustrative embodiments of the invention. These embodiments are indicative, however, of but a few of the various ways in which the principles of the invention may be employed. Other objects, advantages and novel features according to aspects of the invention will become apparent from the following detailed description when considered in conjunction with the drawings.

BRIEF DESCRIPTION OF THE DRAWINGS

The annexed drawings, which are not necessarily to scale, show various aspects of the invention in which similar reference numerals are used to indicate the same or similar parts in the various views.

Figure 1:
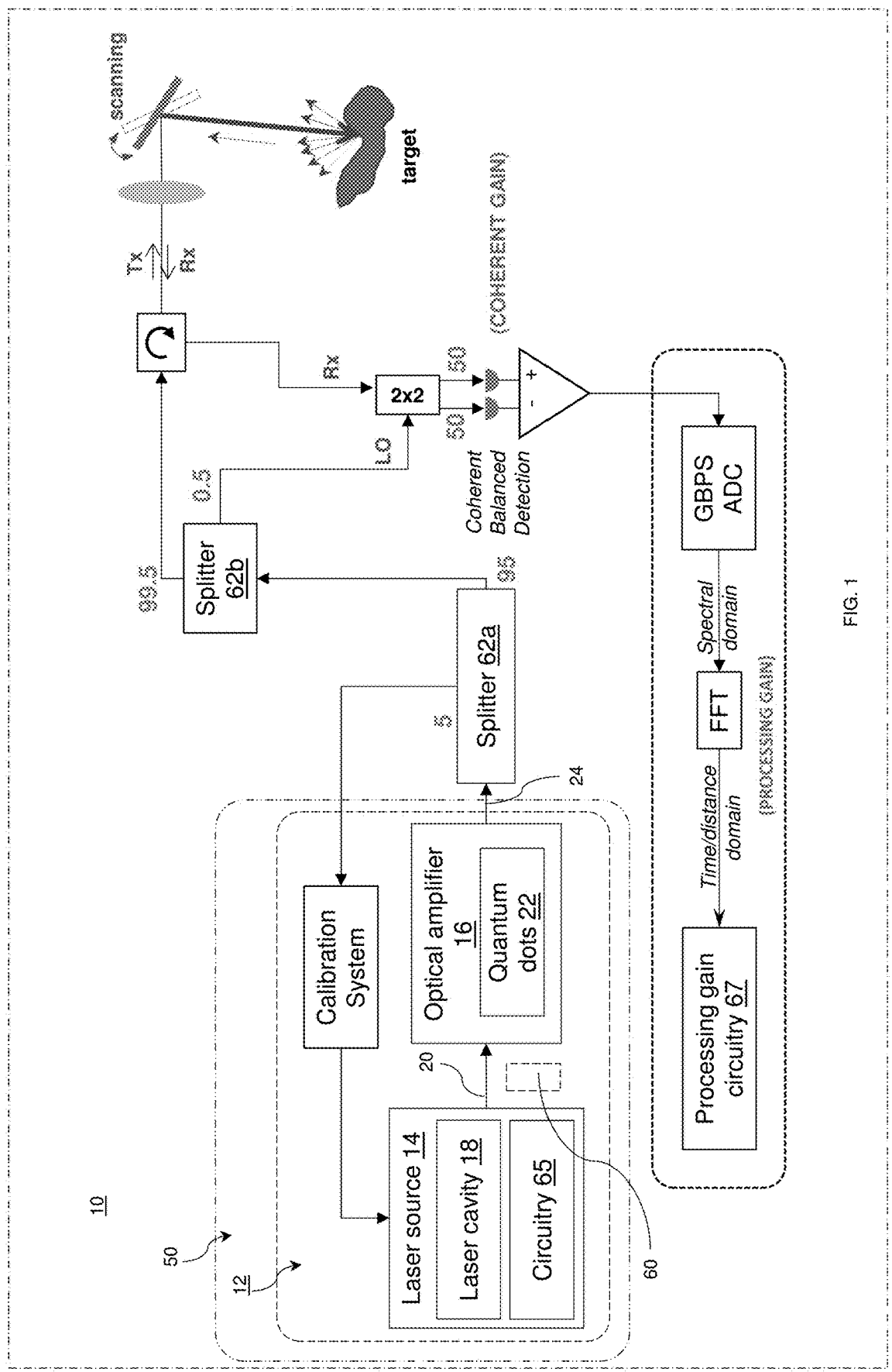
FIG. 1 is an exemplary embodiment of a LiDAR system including an optical amplifier

The present invention is described below in detail with reference to the drawings. In the drawings, each element with a reference number is similar to other elements with the same reference number independent of any letter designation following the reference number. In the text, a reference number with a specific letter designation following the reference number refers to the specific element with the number and letter designation and a reference number without a specific letter designation refers to all elements with the same reference number independent of any letter designation following the reference number in the drawings.

DETAILED DESCRIPTION

In the embodiment depicted in FIG. 1, a LiDAR system 10 including a laser amplification system 12 is shown. The laser amplification system includes a laser source 14 and an optical amplifier 16. The laser source 14 has a laser cavity 18 and is configured to output electromagnetic radiation 20. The optical amplifier includes quantum dots 22 and is positioned outside the laser cavity 18 to receive the electromagnetic radiation 20 output from the laser source 14. The optical amplifier 16 amplifies the received electromagnetic radiation 20 using the quantum dots 22 and outputs the amplified electromagnetic radiation 24.

Figure 2:
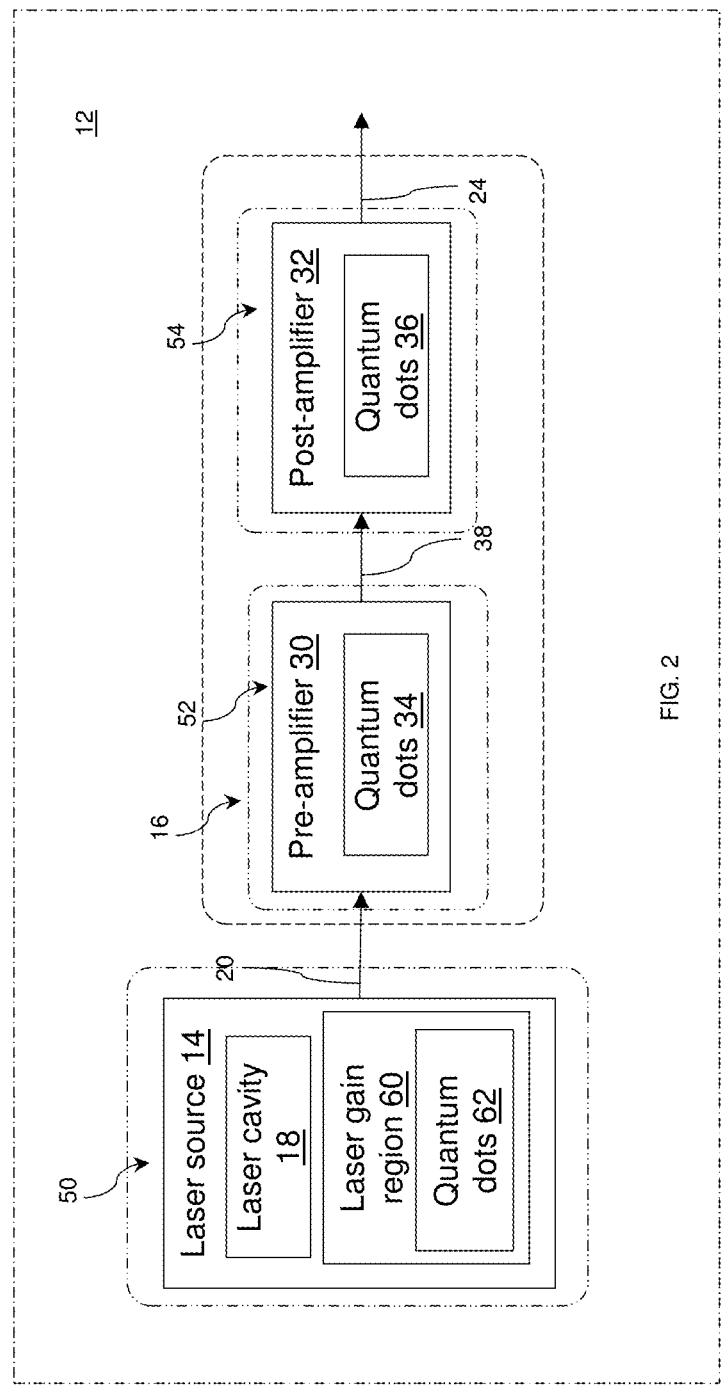
FIG. 2 is an exemplary embodiment of a laser amplification system.

In the embodiment depicted in FIG. 2, the optical amplifier 16 includes a pre-amplifier 30 and a post-amplifier 32. Both the pre-amplifier 30 and the post-amplifier 32 include quantum dots 34, 36. The pre-amplifier 30 receives the electromagnetic radiation 20 output from the laser source 14, amplifies the received electromagnetic radiation 20, and outputs the amplified electromagnetic radiation 38 to the post-amplifier 32. The post-amplifier 32 receives the amplified electromagnetic radiation 38 output from the pre-amplifier 30, further amplifies the amplified electromagnetic radiation 38, and outputs the twice amplified electromagnetic radiation 24.

In this embodiment, multiple amplifiers 30, 32 are used to reduce the required amount of optical gain, optical gain bandwidth and SNR (noise figure) for a single amplifier. For example, if a gain of 100x is needed, it is often better to design with more margin per amplifier to use two amplifiers of 10x instead of one amplifier of 100x. Limiting the requirements can be particularly beneficial outside of the lab setting where changes in temperature, humidity, etc. can cause amplifiers set to higher gain settings to introduce greater noise and artifacts into the amplified light. Alternatively, increases in amplifier temperature can reduce the available gain over a certain bandwidth, which encourages the system designer to derate the gain and bandwidth requirements to as to satisfy the operating temperature range requirement. Also, using multiple optical amplifiers minimizes the potential for back reflection passing back through the optical amplifier. To further limit issues caused by back reflection, optical isolators may be used to prevent back reflections from, e.g., disrupting laser source mode width and line stability. For this reason, isolators may be placed before the pre-amplifier 30, between the pre-amplifier 30 and the post-amplifier 32, and additionally after the post-amplifier 32. The optical isolators may take the form of a faraday rotation crystal combined with a polarizer and possibly a quarter wave rotation plate/film. Alternatively, optical isolators may be integrated into a photonic chip made of Silicon, Silicon Nitride or other optical circuit materials.

In one embodiment, the quantum dots 34 of the pre-amplifier 30 are made of a same material as the quantum dots 36 of the post-amplifier 32, such that a wavelength shift of electromagnetic radiation 38 emitted by the pre-amplifier 30 corresponds to a wavelength shift of the electromagnetic radiation 24 emitted by the post-amplifier 32. For example, the pre-amplifier 30 and the post-amplifier 32 may be made of the same or similar quantum dot materials, but with different lengths or waveguide dimensions. As described above, this provides an advantage that both amplifiers 30, 32 shift similarly with temperature, and both have the benefit of the ability to operate with high reliability of quantum dots at elevated operating temperatures.

Similarly, the laser source 14 may include a laser gain region 62 including quantum dots 64. The quantum dots 34 of the pre-amplifier 30 may be made of a same material as both the quantum dots 36 of the post-amplifier 32 and the quantum dots 64 of the laser gain region 62, such that a shift of the spectral gain curve, noise figure, amplified spontaneous emission and other properties of the pre-amplifier 30 corresponds to a shift of the spectral gain curve, noise figure, amplified spontaneous emission and other properties of both the post-amplifier 32 and electromagnetic radiation 20 emitted by the laser gain region 62. These shifts in the properties of the gain region 62 of the laser or the quantum dots 34 and 36 may result from changes in the overall temperature of the system, systematic shifts in the currents to the semiconductor devices (such as an overall change in currents) or from aging of the semiconductor material.

The laser source 14 may include circuitry 65 for controlling (e.g., tuning a wavelength of the electromagnetic radiation emitted) the laser source 14. As will be understood by one of ordinary skill in the art, the laser source 14 may comprise one or more lasers. In a preferred embodiment, the laser(s) should be appropriately designed or modified to enable the ability to wavelength-tune in a time scale of approximately 1 microsecond or less (e.g., enabling operation for targets located at ranges of approximately 200 meters or less). The laser source(s) 14 may be a semiconductor laser, e.g., a monolithic semiconductor laser, DFB laser, DBR laser, a Vernier-tuned distributed Bragg reflector (VT-DBR) laser, MEMS-tunable semiconductor laser, Vertical Cavity Surface Emitting Laser (VCSEL), VCSEL with Micro-electromechanical systems (MEMS) tuning structures, Vernier-tuned ring laser, Y-branch laser, coupled cavity laser, discrete mode laser, injection-locked or externallystabilized laser, Super-Structure Grating Distributed Bragg Reflector (SSGDBR) laser, hybrid laser using Silicon or Silicon Nitride photonic integrated circuit (PIC) with III-V gain material, or any other suitable type.

The circuitry 65 for controlling the laser and the processing gain circuitry 67 may be embodied as the same hardware (i.e., the same processor, controller, digital signal process (DSP), computer, etc.

The circuitry 65, 67 may have various implementations. For example, the circuitry 65, 67 may include any suitable device, such as a processor (e.g., CPU), programmable circuit, integrated circuit, memory and I/O circuits, an application specific integrated circuit, microcontroller, complex programmable logic device, other programmable circuits, or the like. The circuitry 65, 67 may also include a non-transitory computer readable medium, such as random access memory (RAM), a read-only memory (ROM), an erasable programmable read-only memory (EPROM or Flash memory), or any other suitable medium. Instructions for performing the method described below may be stored in the non-transitory computer readable medium and executed by the circuitry 65, 67. The circuitry 65, 67 may be communicatively coupled to a computer readable medium (i.e., memory) and network interface through a system bus, mother board, or using any other suitable structure known in the art.

Optical amplifiers based on quantum dots are able to achieve higher saturation output power than comparable optical amplifiers based on quantum wells. A quantum dot optical amplifier is able to deliver the 200 mW required for detecting low reflectivity objects at 200 meters and beyond (the current requirement for automotive LiDAR). In particular, InAs quantum dots in the GaAs material system, meet the requirements for optical amplification.

Quantum dots are a gain material that may be integrated with Silicon Photonics, either through bonding or actually growing the quantum dots onto a Silicon substrate. The low rate of defect formation when growing quantum dots on Silicon make it a good candidate for this approach to integration, as is the property of wide gain bandwidth, ability to operate at high temperature, and lower susceptibility to optical feedback as compared to quantum well laser structures.

The quantum dots may be realized in the GaAs system, as InAs quantum dots, with a wavelength range from 1180-1350 nm. Presently, quantum dot amplifiers in GaAs exhibit substantially reduced performance above around 1350 nm, but due to increased eye safety at longer wavelengths in other embodiments we anticipate improvements in GaAs quantum amplifiers that enable operation up to around 1400 nm. Quantum dot optical amplifiers may also be realized in the InP material system, in the wavelength range of 1260-1700 nm. The quantum dot-based chip-scale optical amplifier may be a semiconductor optical amplifier, or may be a tapered waveguide amplifier. The quantum dot optical amplifier may produce at least 200 mW, as coupled from an optical fiber, but therefore the optical power generated from chip may be as much as 400 mW at least. In certain embodiments of a lidar system, multiple output beams may be required. In this case, each beam may need high optical power. This lidar system may be served by a single, high optical power SOA or TA.

In the embodiment depicted in FIG. 2, the laser cavity 18, pre-amplifier 30, and post-amplifier 32 are located on separate chips 50, 52, 54 that are integrated together. The separate chips 50, 52, 54 may be separately packaged and integrated together either through fiber optical coupling, heterogeneous integration strategies as devised for datacom, butt-coupling or other schemes known to those in the art. Separation of the chips into separate packages offers the advantage that the thermal management of each may be optimized, which is particularly important for the high output power final amplifier, but may be a different thermal management approach than is required for the laser cavity. Spatial separation of the laser from the optical amplifier may allow for distinct heat flow paths and heat management structures or devices, unique to either the laser or the optical amplifier.

Conversely, in the embodiment shown in FIG. 1, one or more of the laser cavity 18, pre-amplifier 30, and post-amplifier 32 are located on a same chip 50. For example, the laser cavity 18 and the optical amplifier 16 are included on a same semiconductor chip 50, such that optical coupling losses are reduced between the laser source 14 and the optic amplifier 16. In the depicted embodiment, the laser amplification system 10 includes a single optical amplifier 16. Because the laser source 14 and the optical amplifier 16 are located on the same chip in this embodiment, the system 12 may not suffer optical coupling losses and a pre-amplifier 30 may not be necessary. As shown in FIG. 1, the laser cavity 18 and the optical amplifier 16 may be separated by a photonic integrated circuit structure 60. Among other features and functionality, photonic integrated circuit structure 60 may allow for optical isolation between the laser source 14 and the optical amplifier 16.

Figure 4:
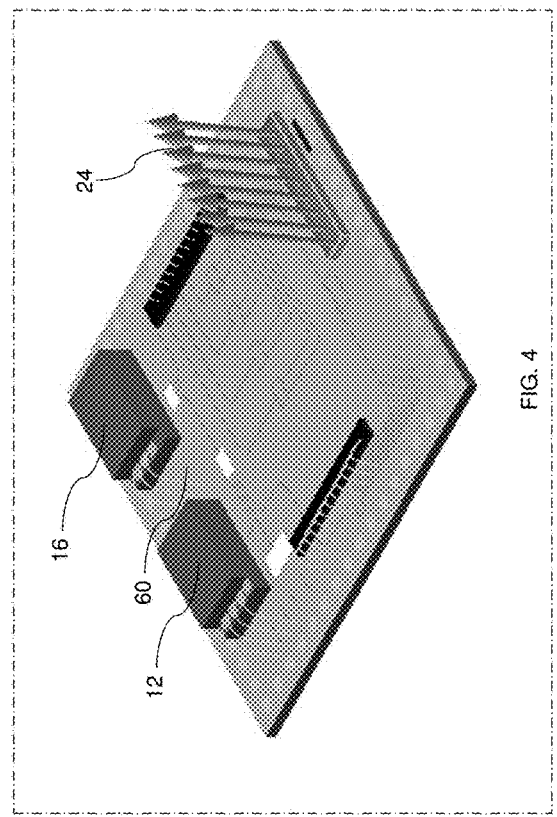
FIG. 4 is an exemplary embodiment of a single chip LiDAR system.

An embodiment of the heterogeneous integration strategy is show in FIG. 4. Laser source 12 is shown separately packaged and coupled to photonic integrated circuit structure 60. Optical amplifier 16 is shown as separately packaged from laser source 12 and coupled to photonic integrated circuit structure 60. Light passes through photonic integrated circuit structure 60, which may comprise splitters 62 or 68, or other aspects of the lidar system. Electromagnetic radiation 24 is emitted from the photonic integrated circuit structure 60, to illuminate a potential target.

Figure 5:
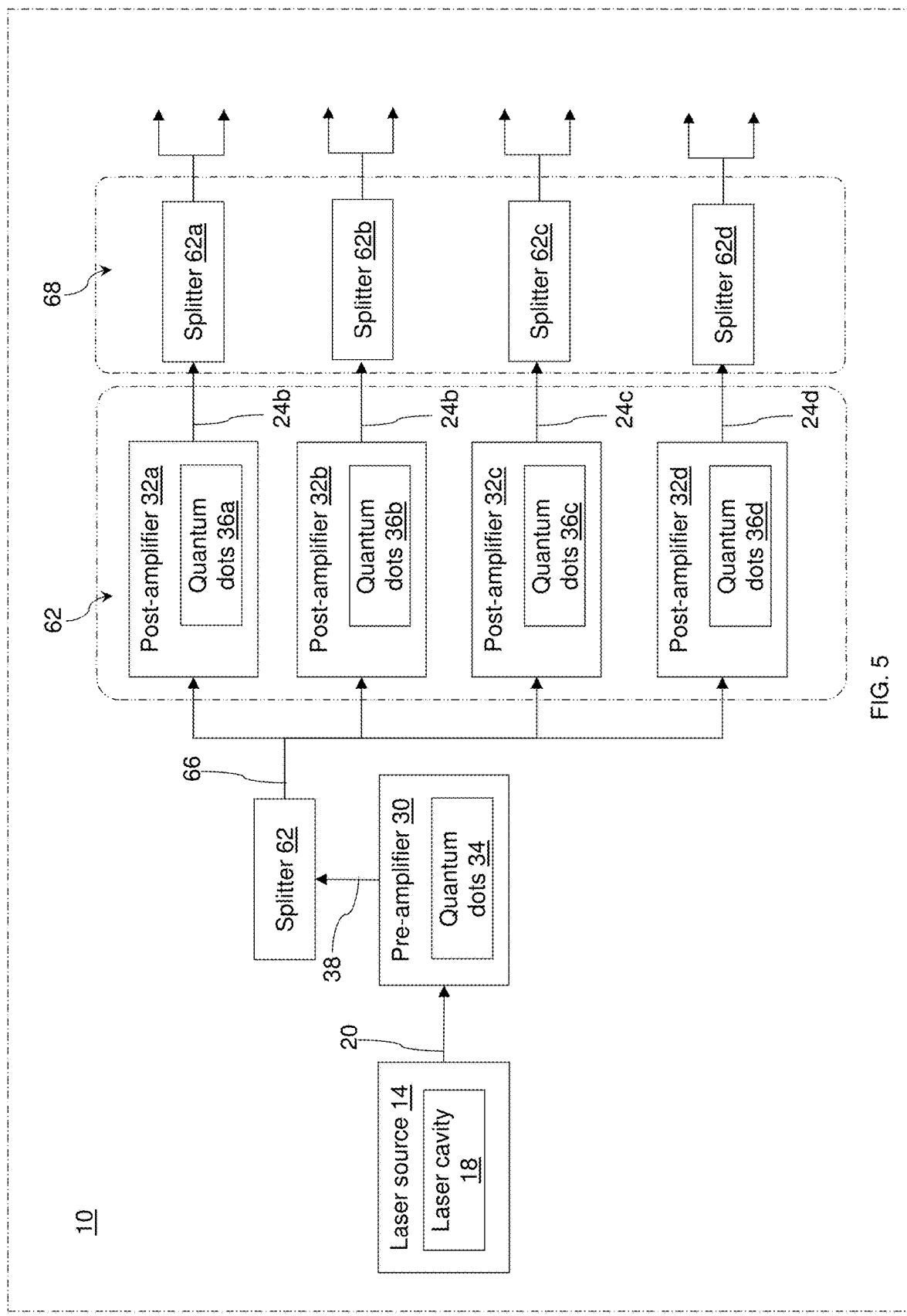
FIG. 5 is an exemplary embodiment of a multibeam LiDAR system.

Turning to the embodiment shown in FIG. 5, a multibeam LiDAR system 10 is shown. The system 10 includes a laser source 14, a pre-amplifier 30, a beam splitter 62, and an array of post-amplifiers 64. The laser source 14 has a laser cavity 18 and is configured to output electromagnetic radiation 20. The pre-amplifier 30 includes quantum dots 34 and is positioned outside the laser cavity 18 to receive the electromagnetic radiation 20 output from the laser source 12. The pre-amplifier 30 is configured to amplify the received electromagnetic radiation 20 using the quantum dots 34 and output the amplified electromagnetic radiation 38. The beam splitter 62 is configured to split the amplified electromagnetic radiation 38 and output the split electromagnetic radiation 66. The array of post-amplifiers located on a single semiconductor chip, each of the post-amplifiers 32 made from quantum dots 36 and positioned outside the laser cavity 18 to receive a portion of the split electromagnetic radiation 66. Each post-amplifier 32 is configured to amplify the received split electromagnetic radiation 66 using the quantum dots 36 and output the amplified split electromagnetic radiation 24.

The multibeam LiDAR system 10 may further include an array of splitters 68. Each of the splitters 62 is positioned to receive amplified split electromagnetic radiation 66 and is configured to further split the amplified split electromagnetic radiation into multiple outputs. The array of post-amplifiers 68 may include four or more post-amplifiers 32. Each portion of the electromagnetic radiation emitted has an optical power of 200 mW or more.

LiDAR systems in the art are only able to achieve the necessary optical power levels with large, non-semiconductor based optical amplifiers. For coherent LiDAR applications involving consumers, consumer devices, autonomous/self-driving/driver-assisted vehicles, drones, and many others, it is imperative that the LiDAR system be operated as a Class 1 eyesafe device. Often, this means that the system is operated at a wavelength longer than or approximately 1.0 microns (often 1.06 um, 1.31 um, 1.55 um, 1.9 um, 2.1 um, and others). Typical SOA technology (involving quantum wells) in these wavelength regions has been developed for applications such as fiber telecom, but the achievable power levels from those devices are limited. Typical max power levels available in commercial SOAs are less than or equal to (20 dBm) 100 mW. One example is the ThorLabs BOA1007C, an InP quantum-well based device with a saturation output power of 18 dBm (63 mW). By contrast, most FMCW LiDAR systems designed to sense at distances greater than 50 m may require 100-200 mW (or more) output power and so use rare earth-doped fiber-based amplifiers rather than SOAs, in order to reach the required optical power levels at eye safe wavelengths of 1550 nm. However, those fiber amplifiers are not compatible with small-size, high-volume, low-cost manufacturing. It is desirable to replace those fiber amplifiers with a chip-based solution, such as SOAs, provided that performance can be maintained.

Figure 3:
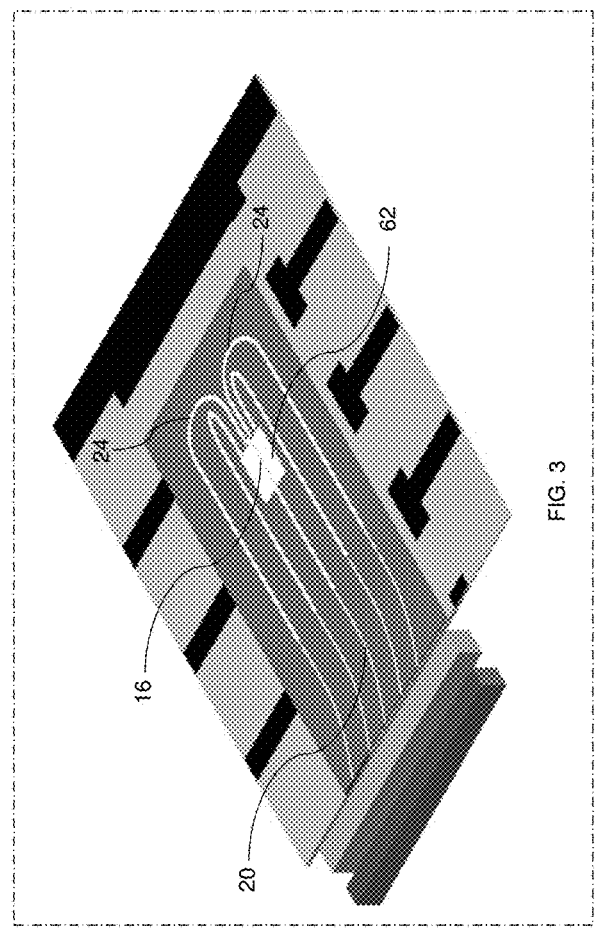
FIG. 3 is an exemplary embodiment of a one-sided optical amplifier.

Quantum dot-based optical amplifiers 16 provide the performance necessary to replace fiber amplifiers, leading to a coherent LiDAR solution that is truly chip-scale. A quantum dot-based optical amplifier provides power levels exceeding its quantum well counterparts, along with less temperature sensitivity and higher reliability. As shown in FIG. 3, such optical amplifiers 16 may be configured as one-sided devices. A one-sided embodiment of the amplifier may provide an advantage in easier optical alignment between the amplifier and the inputs/outputs to the rest of the Lidar system. That is, the electromagnetic radiation may be received on the same side of the device that the electromagnetic radiation is emitted from the device. In this embodiment, the optical amplifiers are included on a single chip and a curved waveguide is used to direct the electromagnetic radiation entering and exiting the optical amplifier array to limit spurious back reflections. Alternatively, the optical amplifiers 16 may be embodied as two-sided devices, as tapered amplifiers, or as amplifier arrays. In another embodiment, the optical amplifier array is reflective, such that light coming in from one side of the chip is passed through the amplifier(s), reflects off of the reflector, and passes back through the amplifier (being amplified again) (increasing the path length).

Coherent LiDAR typically requires a very high-performance laser as the primary optical source, and it is typically beneficial to separate the laser source from the optical amplifier. However, another embodiment uses a configuration where the laser and SOA are on a single chip as part of a single waveguiding structure. Yet another embodiment uses a laser, pre-amplifier, and power amplifier all as part of a single chip, single waveguiding structure. Any or all of these amplifiers may be a tapered amplifier, or may utilize mode shaping for management of the optical waveguiding path.

A specific embodiment of the LiDAR system 10 may be a coherent LiDAR system for use in the autonomous vehicle market segment. In this embodiment, the LiDAR system 10 may include a semiconductor laser with wavelength approximately 1310 nm, and an optical amplifier 16 using indium arsenide quantum dots 22 in gallium arsenide with aluminum gallium arsenide barriers, all on gallium arsenide substrates. Such a system can provide optical output power exceeding 200 mW, thus providing high-speed sensing at distances up to and beyond 200 m. The laser in such a system may utilize a gain medium based on either quantum wells or quantum dots.

Figure 6:
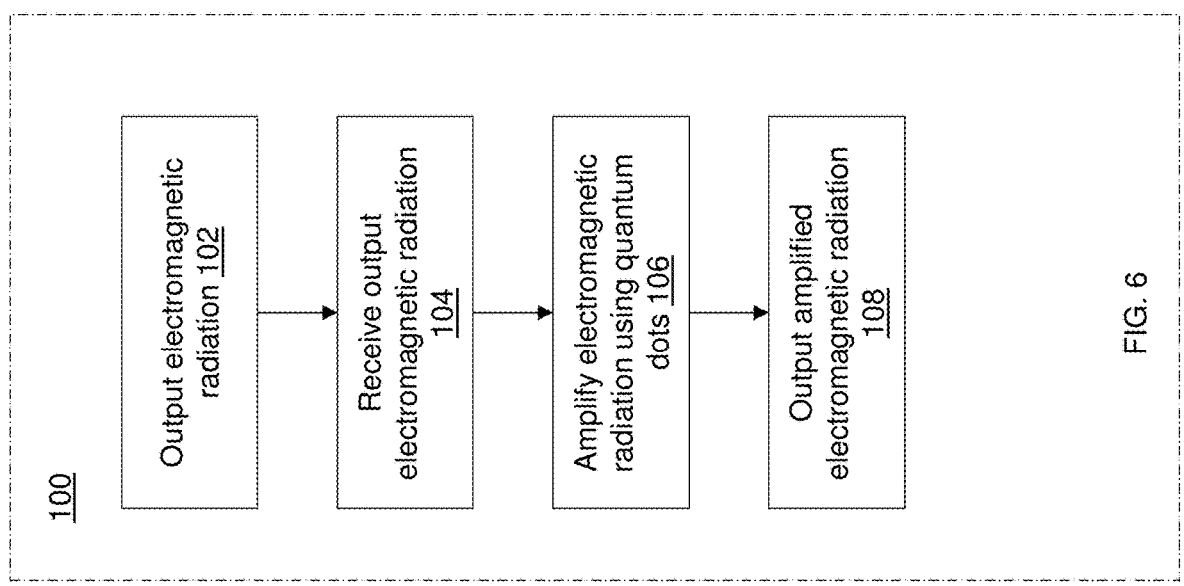
FIG. 6 is a flow chart depicting an embodiment of a method for controlling amplification in a LiDAR system including a laser source and an optical amplifier made from quantum dots.

Turning to FIG. 6, a method 100 for controlling amplification in a LiDAR system including a laser source and an optical amplifier made from quantum dots is shown. In process block 102, electromagnetic radiation is output using the laser source 14. In process block 104, the outputted electromagnetic radiation 20 is received with the optical amplifier 16. In process block 106, the received electromagnetic radiation 20 is amplified using the quantum dots 22. In process block 108, the amplified electromagnetic radiation 24 is output.

Figure 7:
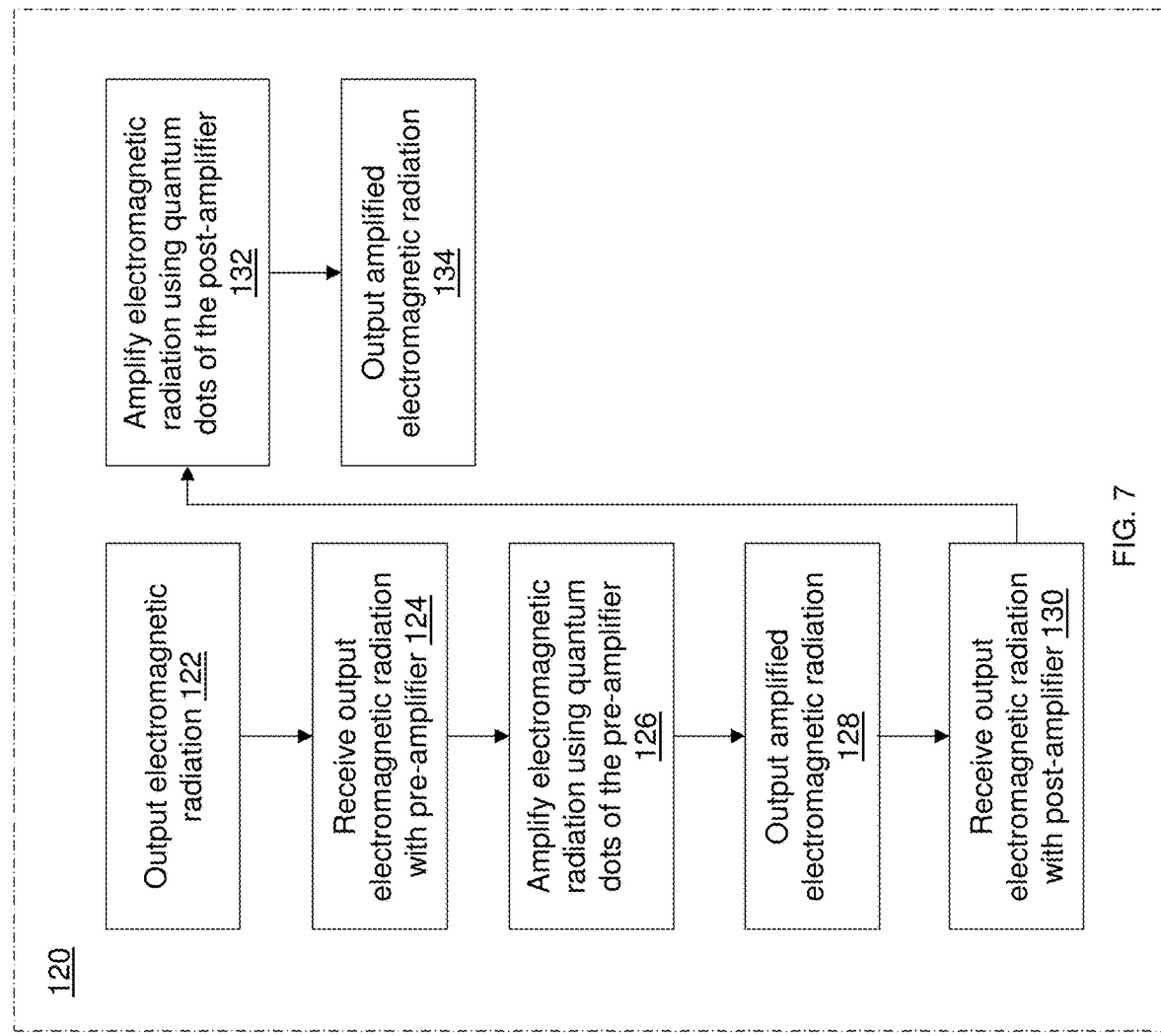
FIG. 7 is a flow chart depicting an embodiment of a method for controlling amplification in a LiDAR system including a laser source and a pre-amplifier and a post-amplifier made from quantum dots.

Turning to FIG. 7 a method 120 for controlling amplification in a LiDAR system including a laser source and a pre-amplifier and a post-amplifier both made from quantum dots is shown. In process block 122, electromagnetic radiation is output using the laser source 14. In process block 124, the outputted electromagnetic radiation 20 is received with the pre-amplifier. In process block 126, the received electromagnetic radiation 20 is amplified using the quantum dots 36 of the pre-amplifier. In process block 128, the amplified electromagnetic radiation 28 is output from the pre-amplifier 30. In process block 130, the post-amplifier 32 receives the amplified electromagnetic radiation 38 output by the pre-amplifier 30. In process block 132, the post-amplifier 32 amplifies the received amplified electromagnetic radiation 38. In process block 134, the electromagnetic radiation amplified by the post-amplifier 24 is output.

All ranges and ratio limits disclosed in the specification and claims may be combined in any manner. Unless specifically stated otherwise, references to "a," "an," and/or "the" may include one or more than one, and that reference to an item in the singular may also include the item in the plural.

Although the invention has been shown and described with respect to a certain embodiment or embodiments, equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

The invention claimed is:
1. A LiDAR system comprising:
    a laser source having a laser cavity and configured to output electromagnetic radiation; and
    an optical amplifier including quantum dots and positioned outside the laser cavity to receive the electromagnetic radiation output from the laser source;

wherein the optical amplifier is configured to:
amplify the received electromagnetic radiation using the quantum dots; and
output the amplified electromagnetic radiation.

2. The LiDAR system of claim 1, wherein:
the optical amplifier includes a pre-amplifier and a post-amplifier;
both the pre-amplifier and the post-amplifier include quantum dots;
the pre-amplifier receives the electromagnetic radiation output from the laser source, amplifies the received electromagnetic radiation, and outputs the amplified electromagnetic radiation to the post-amplifier;
the post-amplifier receives the amplified electromagnetic radiation output from the pre-amplifier, further amplifies the amplified electromagnetic radiation, and outputs the twice amplified electromagnetic radiation.

3. The LiDAR system of claim 2, wherein the quantum dots of the pre-amplifier are made of a same material as the quantum dots of the post-amplifier, such that a shift in amplification properties of the pre-amplifier corresponds to a shift in amplification of the post-amplifier.

4. The LiDAR system of claim 2, wherein the laser cavity, preamplifier, and post-amplifier are located on separate chips that are integrated together.

5. The LiDAR system of claim 1, wherein the laser source includes a laser gain region and the laser gain includes quantum dots.

6. The LiDAR system of claim 2, wherein the quantum dots of the pre-amplifier are made of a same material as both the quantum dots of the post-amplifier and the quantum dots of the laser gain region, such that a shift in amplification properties of the pre-amplifier corresponds to a shift in amplification properties of the post-amplifier and a shift in amplification properties of the laser gain region.

7. The LiDAR system of claim 1, wherein the laser cavity and the optical amplifier are included on a same semiconductor chip, such that optical coupling losses are reduced between the laser source and the optic amplifier.

8. The LiDAR system of claim 7, wherein the LiDAR system includes a single optical amplifier.

9. The LiDAR system of claim 7, wherein the laser cavity and the optical amplifier are separated by a photonic integrated circuit structure.

10. The LiDAR system of claim 2, wherein the pre-amplifier and the post-amplifier are separated by a photonic integrated circuit structure.

11. The LiDAR system of claim 1, wherein:
the laser source comprises a semiconductor laser;
the optical amplifier has a gallium arsenide (GaAs) substrate; and
the quantum dots are made from indium arsenide (InAs) and have a wavelength output included in a range of 1180-1400 nm.

12. The LiDAR system of claim 1, wherein the quantum dots are made from indium phosphide (InP) and have a wavelength output included in a range of 1260-1700 nm.

13. The LiDAR system of claim 1, wherein the laser source is tunable to alter a wavelength of the outputted electromagnetic radiation.

14. A multibeam LiDAR system including:
a laser source having a laser cavity and configured to output electromagnetic radiation;
a pre-amplifier including quantum dots and positioned outside the laser cavity to receive the electromagnetic radiation output from the laser source;
wherein the pre-amplifier is configured to:
amplify the received electromagnetic radiation using the quantum dots; and
output the amplified electromagnetic radiation;
a beam splitter configured to split the amplified electromagnetic radiation and output the split electromagnetic radiation;
an array of optical amplifiers located on a single semiconductor chip, each of the optical amplifiers made from quantum dots and positioned outside the laser cavity to receive a portion of the split electromagnetic radiation;
wherein each of the array of optical amplifiers is configured to:
amplify the received split electromagnetic radiation using the quantum dots; and
output the amplified split electromagnetic radiation.

15. The multibeam LiDAR system of claim 14, further comprising an array of splitters, each of the splitters positioned to receive amplified split electromagnetic radiation and configured to further split the amplified split electromagnetic radiation into multiple outputs.

16. The multibeam LiDAR system of claim 14, wherein the array of optical amplifiers include four or more optical amplifiers.

17. The multibeam LiDAR system of claim 14 wherein each portion of the electromagnetic radiation emitted has an optical power of 200 mW or more.

18. A method for controlling amplification in a LiDAR system including a laser source and an optical amplifier made from quantum dots, the method comprising:
outputting electromagnetic radiation using the laser source;
receiving the outputted electromagnetic radiation with the optical amplifier;
amplifying the received electromagnetic radiation using the quantum dots; and
outputting the amplified electromagnetic radiation.

19. The method of claim 18, wherein:
receiving the outputted electromagnetic radiation with the optical amplifier comprises receiving the outputted electromagnetic radiation with a pre-amplifier of the optical amplifier;
amplifying the received electromagnetic radiation using the quantum dots comprises:
amplifying the received electromagnetic radiation using the quantum dots of the pre-amplifier;
outputting the electromagnetic radiation amplified by the pre-amplifier;
a post-amplifier of the optical amplifier receiving the electromagnetic radiation amplified by the pre-amplifier; and
amplifying the received amplified electromagnetic radiation using the quantum dots of the post-amplifier;
outputting the amplified electromagnetic radiation comprises outputting the electromagnetic radiation amplified by the post-amplifier.

20. A laser amplification system comprising:
a laser source having a laser cavity and configured to output electromagnetic radiation; and
an optical amplifier including quantum dots and positioned outside the laser cavity to receive the electromagnetic radiation output from the laser source;

wherein the optical amplifier is configured to:
amplify the received electromagnetic radiation using the quantum dots; and
output the amplified electromagnetic radiation.

* * * * *